United States Patent
Park et al.

(10) Patent No.: US 6,836,075 B2
(45) Date of Patent: Dec. 28, 2004

(54) ACTIVE MATRIX ORGANIC ELECTROLUMINESCENCE DISPLAY DEVICE AND METHOD FOR MANUFACTURING THE SAME

(75) Inventors: Jae Yong Park, Seoul (KR); Sung Ki Kim, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/026,476

(22) Filed: Dec. 27, 2001

(65) Prior Publication Data

US 2002/0101178 A1 Aug. 1, 2002

(30) Foreign Application Priority Data

Dec. 29, 2000 (KR) ........................................ 2000-85560

(51) Int. Cl.[7] .................................................. G09G 3/30
(52) U.S. Cl. ...................... 315/169.3; 345/76; 313/500; 438/487
(58) Field of Search ................................. 313/500, 505, 313/506; 315/169.3, 169.1; 345/26, 77; 438/487, 149

(56) References Cited

U.S. PATENT DOCUMENTS

| 4,382,658 | A | 5/1983 | Shields et al. ............... 349/122 |
|---|---|---|---|
| 4,727,047 | A | 2/1988 | Bozler et al. ................ 438/464 |
| 4,855,014 | A | 8/1989 | Kakimoto et al. ............. 117/45 |
| 5,061,655 | A | 10/1991 | Ipposhi et al. ................ 117/45 |
| RE33,836 | E | 3/1992 | Resor, III et al. ............. 355/43 |
| 5,204,659 | A | 4/1993 | Sarma ......................... 345/89 |
| 5,409,867 | A | 4/1995 | Asano ........................ 438/487 |
| 5,496,768 | A | 3/1996 | Kudo .......................... 438/487 |
| 5,529,951 | A | 6/1996 | Noguchi et al. ............. 438/487 |
| 5,684,365 | A | * 11/1997 | Tang et al. ............... 315/169.3 |
| 5,766,989 | A | 6/1998 | Maegawa et al. ........... 438/166 |
| 5,998,805 | A | * 12/1999 | Shi et al. ..................... 257/40 |
| 6,057,647 | A | * 5/2000 | Kurosawa et al. ....... 315/169.3 |
| 6,246,179 | B1 | * 6/2001 | Yamada .................. 315/169.3 |
| 6,307,322 | B1 | * 10/2001 | Dawson et al. .......... 315/169.1 |
| 6,380,688 | B1 | * 4/2002 | Bae et al. ................. 315/169.3 |
| 6,451,631 | B1 | * 9/2002 | Grigoropoulos et al. .... 438/149 |
| 6,462,722 | B1 | * 10/2002 | Kimura et al. ................ 345/76 |

* cited by examiner

Primary Examiner—Don Wong
Assistant Examiner—Ephrem Alemu
(74) Attorney, Agent, or Firm—McKenna Long & Aldridge LLP

(57) ABSTRACT

An active matrix organic electroluminescence display device and a method for manufacturing the same are disclosed. The active matrix organic electroluminescence display device includes a scan line in one direction, a data line substantially perpendicular to the scan line, a power line substantially parallel to the data line a distance from the data line, an electroluminescence device emitting light in a pixel region among the scan line, the data line and the power line, a switching transistor for switching a signal of the data line according to a signal of the scan line, and a driving transistor for applying a power supply of the power line to the electroluminescence device according to a signal applied through the switching transistor, the switching transistor or the driving transistor formed by a sequential lateral solidification (SLS) method.

9 Claims, 7 Drawing Sheets

ACTIVE MATRIX ORGANIC ELECTROLUMINESCENCE DISPLAY DEVICE AND METHOD FOR MANUFACTURING THE SAME

This application claims the benefit of the Korean Application No. P.2000-085560 filed on Dec. 29, 2000, which is hereby incorporated by reference for all purposes as if fully set forth herein.

BACKGROUND OF THE INVENTION

1. Field of the Invention

The present invention relates to an active matrix organic electroluminescence display device, and more particularly, to an active matrix electroluminescence display device and a method for manufacturing the same by a sequential lateral solidification (SLS) method that can obtain greater uniformity of luminance and a packing density of an integrated circuit (IC) than a related art low temperature poly process.

2. Discussion of the Related Art

Recently, various display devices such as liquid crystal display (LCD) device, a plasma display panel (PDP) device, a field emission display (FED) device and an electroluminescence (EL) device have been studied with development of flat display devices. These flat display devices are classified into two types according to a driving method: a passive matrix method and an active matrix method. The passive matrix method requires current greater than the active matrix method.

Accordingly, in current driving methods of the FED and EL devices, it is regarded that the active matrix method is more efficient than the passive matrix method because the passive matrix method requires a greater current level than the active matrix method even though a line transmission time is equal.

FIG. 1 is an equivalent circuit diagram of a unit pixel in a related art two transistor (2T) active matrix organic electroluminescence display (OED) device.

As shown in FIG. 1, the related art active matrix organic electroluminescence display device includes a scan line 1, a data line 2, a power line 3, an electroluminescence device 7, a switching transistor 4, a driving transistor 5 and a capacitor 6.

At this time, the scan line 1 is formed in one direction, and then the data line 2 is formed perpendicular to the scan line 1. The power line 3 is formed in parallel to the data line 2 at a distance from the data line 2. The electroluminescence device 7 emits lights according to a voltage applied in a pixel region formed by the scan line 1, the data line 2 and the power line 3. The switching transistor 4 switches a signal of the data line 2 according to a signal of the scan line 1. Subsequently, the driving transistor 5 applies a power supply of the power line to the electroluminescence device according to a signal applied through the switching transistor 4. The capacitor 6 is formed between the power line 3 and a gate electrode of the driving transistor 5.

A structure of the unit pixel in the related art active matrix organic electroluminescence display device and a method of manufacturing the same will be described with reference to the accompanying drawings.

FIG. 2 is a layout of the related art active matrix organic electroluminescence display device of FIG. 1.

FIG. 3 is a sectional view of the related art active matrix organic electroluminescence display device taken along line I-I' of FIG. 2.

First and second semiconductor layers 4a and 5a having an island-shape are formed on portions of a substrate 10 where the switching and driving transistors 4 and 5 will be formed, respectively. At this time, an amorphous silicon a-Si:H is deposited on entire surface of the substrate. Then, the amorphous silicon is crystallized to a polysilicon in a scanning method using an excimer laser and is selectively removed to form the first and second semiconductor layers 4a and 5a.

A gate insulating layer 30 is formed on the entire surface of the substrate 10 including the first and second semiconductor layers 4a and 5a. Then, the scan line 1 is formed to cross the first semiconductor layer 4a on the gate insulating layer 30, and the gate electrode of the driving transistor 5b is formed to cross the second semiconductor layer 5a. At this time, the scan line 1 and the gate electrode 5b of the driving transistor are isolated from each other, and the gate electrode 5b is widened at a certain portion to form a capacitor overlapped with the power line 3, which will be formed in a later step.

Impurity ions are injected to the first and second semiconductor layers at both sides of the scan line 1 and the gate electrode 5b of the driving transistor, thereby forming source/drain regions, respectively.

Accordingly, the switching transistor 4 is formed by the scan line 1 and the first semiconductor layer 4a, and the driving transistor 5 is formed by the gate electrode 5b and the second semiconductor layer 5a.

An insulating interlayer 50 is formed on the entire surface of the substrate including the scan line 1 and the gate electrode 5b, and then contact holes are respectively formed at source and drain regions and the gate electrode 5b of the first semiconductor layer 4a, and the source region of the second semiconductor layer 5a.

The data line 2 connected with the source region of the first semiconductor layer 4a is formed perpendicular to the scan line 1 on the insulating interlayer 50. The power line 3 connected with the source region of the second semiconductor layer 5a is formed perpendicular to the scan line 1 to be overlapped with the gate electrode 5b. Then, an electrode pattern 20 is formed to connect the drain region of the first semiconductor layer 4a to the gate electrode 5b. At this time, the capacitor 6 is formed in a portion where the gate electrode 5b and the power line 3 overlap each other.

Then, an insulating layer 70 for planarization is formed on the entire surface of the substrate 10. The contact hole is formed at the drain region of the second semiconductor layer 5a on the insulating layer 70, thereby forming the electroluminescence device 7 connected to the drain region.

A method of manufacturing the related art active matrix organic electroluminescence display device having the above structure will be described as follows.

The amorphous silicon a-Si:H is deposited on the substrate 10, and then is crystallized to the polysilicon by an exicmer laser. Then, the crystallized polysilicon is selectively removed to form the first and second semiconductor layers 4a and 5a having an island shape corresponding to portions where the switching and driving transistors 4 and 5 will be formed, respectively.

A method for crystallizing the amorphous silicon to the polysilicon by the scanning method of the excimer laser will be described in detail.

FIG. 4 is a plan view for illustrating the method of crystallizing according to a related art laser annealing method (scanning method).

A laser beam having a width of 0.5 mm or less and a length shorter than an LCD panel is emitted to the amorphous silicon for crystallizing the amorphous silicon as polysilicon in the scanning method. At this time, the laser beam is transferred at 25 µm per pulse from one side of the LCD panel to other side vertically.

The gate insulating layer 30 is formed on the entire surface of the substrate 10 including the first and second semiconductor layers 4a and 5a, and then a metal layer is deposited on the entire surface of the substrate. Then, the metal layer is selectively removed to form the scan line 1 crossing the first semiconductor layer 4a on the gate insulating layer 30, simultaneously, to form the gate electrode 5b of the driving transistor crossing the second semiconductor layer 5a. At this time, the scan line 1 and the gate electrode 5b of the driving transistor are isolated from each other. Then the gate electrode 5b is widened at a certain portion to form a capacitor overlapped with the power line 3, which will be formed in a later step.

Impurity ions are injected to the first and second semiconductor layers 4a and 5a using the scan line 1 and the gate electrode 5b of the driving transistor as masks, thereby forming the source and drain regions of the switching and driving transistors.

Accordingly, the switching device 4 is formed by the scan line 1 and the first semiconductor layer 4a, and the driving transistor 5 is formed by the gate electrode 5b and the second semiconductor layer 5a.

The insulating interlayer 50 is formed on the entire surface of the substrate 10 including the scan line 1 and gate electrode 5b. Then, the insulating interlayer 50 and the gate insulating layer 30 are selectively removed to expose the source and drain regions and the gate electrode 5b of the first semiconductor layer 4a, and the source region of the second semiconductor layer 5a, thereby forming each contact hole.

The metal layer is deposited on the entire surface of the substrate and then is selectively removed. Therefore, the data line 2 connected with the source region of the first semiconductor layer 4a is formed perpendicular to the scan line 1 on the insulating interlayer 50. Simultaneously, the power line 3 connected with the source region of the second semiconductor layer 5a is formed perpendicular to the scan line 1 to be overlapped with the gate electrode 5b. Then, the electrode pattern 20 is formed to connect the drain region of the first semiconductor layer 4a to the gate electrode 5b.

Then, the insulating layer 70 is formed on the entire surface of the substrate. The contact hole is formed at the drain region of the second semiconductor layer 5a on the insulating layer 70, thereby forming the electroluminescence device 7 connected to the drain region.

However, the related art active matrix organic electroluminescence display device and the method for manufacturing it have the following problems.

FIG. 5 illustrates a grain boundary and a carrier movement direction of the polysilicon in the crystallizing method of the related art scanning method.

The amorphous silicon is crystallized to polysilicon by the excimer laser to form the first and second semiconductor layers, but the grain boundary is irregularly formed perpendicular to a channel direction. Accordingly, an operating voltage of each transistor is not uniform, thereby generating a line on a display panel.

That is, the amorphous silicon is deposited on the substrate, and then the amorphous silicon is crystallized to polysilicon in the scanning method by the excimer laser. At this time, the amorphous silicon includes Hydrogen at a certain ratio. Therefore, Hydrogen has to be removed and the amorphous silicon has to be crystallized at a low temperature to prevent deformation from occurring in the substrate. That is, the manufacturing process steps are complicated.

Also, a certain pulse is applied to each scanning line in the scanning method by the excimer laser, and the laser is not successively emitted. Accordingly, laser energy emitted to each scanning line is not uniform, thereby generating the line on the display panel. That is, a characteristic of a TFT according to each scanning line is irregular due to the lines on the display panel, so that the lines are reflected to the active matrix organic electroluminescence display device, thereby degrading uniformity of luminance.

That is, the semiconductor layer serves as a channel, and a current path is formed of silicon. At this time, a crystallized state of the silicon grain is irregular, so that the characteristic of the TFT driving each pixel is different. Therefore, even though an equal gray level is applied, the amount of the current in each TFT is different, thereby generating a luminance difference between pixels.

Also, since a size of the silicon grain is not regular, a non-uniform characteristic is generated in a boundary of the grain during fabricating the TFT, thereby generating non-uniform luminance.

To solve a problem such as the non-uniform luminance, technology forming four TFTs in the pixel region is used. However, the technology may generate defects in manufacturing process steps. Also, an aperture ratio may be decreased by an increased number of TFTs.

SUMMARY OF THE INVENTION

Accordingly, the present invention is directed to an active matrix organic electroluminescence display device that substantially obviates one or more problems due to limitations and disadvantages of the related art.

An advantage of the present invention is to provide an active matrix organic electroluminescence display device in which a thin film transistor (TFT) of a driving part for driving an electroluminescence (EL) device and/or a TFT of a driving integrated circuit (IC) connected to the driving part are/is manufactured by a sequential lateral solidification (SLS) method, so that uniformity of the TFT characteristic is improved, thereby improving uniformity of luminance.

Another advantage of the present invention is to provide an active matrix organic electroluminescence display device in which a TFT of a driver IC (external driving circuit) is formed by an SLS method, so that it is possible to form a pixel and a driving circuit in the same substrate, thereby miniaturizing the active matrix organic electroluminescence display device by improving packing density.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, an active matrix organic electroluminescence display device includes a scan line in one direction, a data line substantially perpendicular to the scan line, a power line substantially parallel to the data line, keeping a distance with the data line, an electroluminescence device emitting light, formed in a pixel region among the scan line, the data line and the power line, a switching transistor switching a signal of the data line according to a signal of the scan line, and a driving transistor applying a power supply of the power line to the electroluminescence device according to a signal applied through the switching transistor, the switching transistor or the driving transistor formed by a sequential lateral solidification (SLS) method.

In another aspect of the present invention, a method for manufacturing an active matrix organic electroluminescence display device includes the steps of depositing an amorphous silicon on a substrate, crystallizing the amorphous silicon to a polysilicon by an SLS method, forming first and second semiconductor layers in portions where switching and driving transistors will be formed by selectively removing the crystallized polysilicon, forming a gate insulating film on an entire surface of the substrate including the semiconductor layers, forming a scan line to cross the first semiconductor layer on the gate insulating layer, simultaneously, a gate electrode of the driving transistor to cross the second semiconductor layer, forming source and drain regions of switching and driving transistors on the first and second semiconductor layers at both sides of the scan line and the gate electrode of the driving transistor, depositing an insulating interlayer on the entire surface of the substrate, forming contact holes to expose the source and drain regions of the first semiconductor layer, the gate electrode of the driving transistor and the source region of the second semiconductor layer, respectively, forming a data line connected to the source region of the first semiconductor layer substantially perpendicular to the scan line on the insulating interlayer, simultaneously, a power line connected to the source region of the second semiconductor layer substantially perpendicular to the scan line, being overlapped with the gate electrode of the driving transistor, at the same time, an electrode pattern to connect the drain region of the first semiconductor layer to the gate electrode of the driving transistor, forming an insulating layer for planarization to have a contact hole in the drain region of the second semiconductor layer, and forming an electroluminescence device connected to the drain region on the insulating layer.

In the present invention, at least one of a TFT of a driving part for driving an EL device and a TFT of a drive IC for driving the TFT of the driving part is formed by an SLS method, so that a polysilicon having crystallized grain and uniform grain size is formed, thereby improving uniformity of TFT characteristic. Therefore, uniform luminance of each pixel can be obtained in an active matrix organic electroluminesce display device driven by the TFT.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, similar reference numbers will be used throughout the drawings to refer to the same or like parts.

Figure 1:
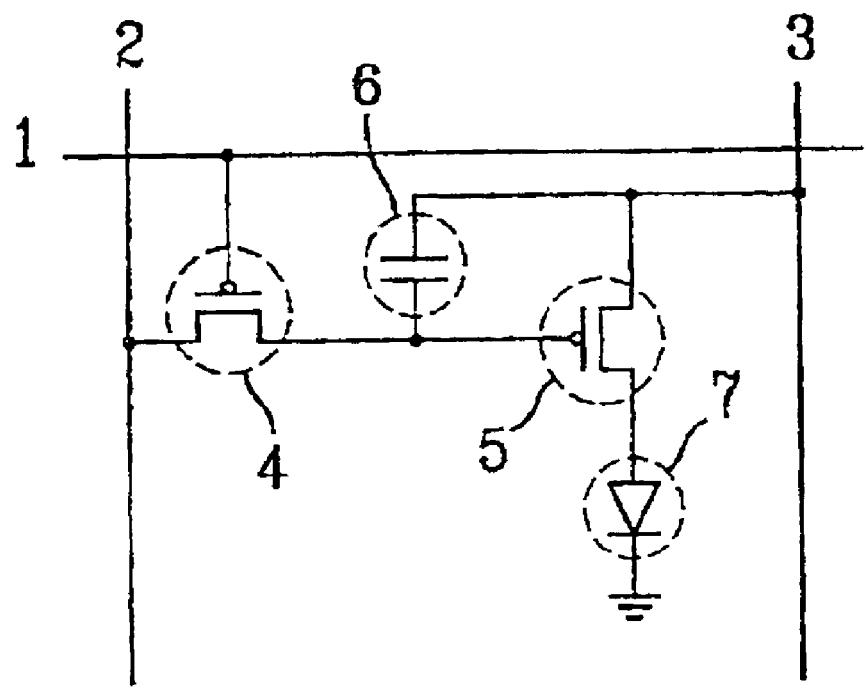
FIG. 1 illustrates an equivalent circuit diagram of a unit pixel of a related art two transistor (2T) active matrix organic electroluminescence display device.
Figure 2:
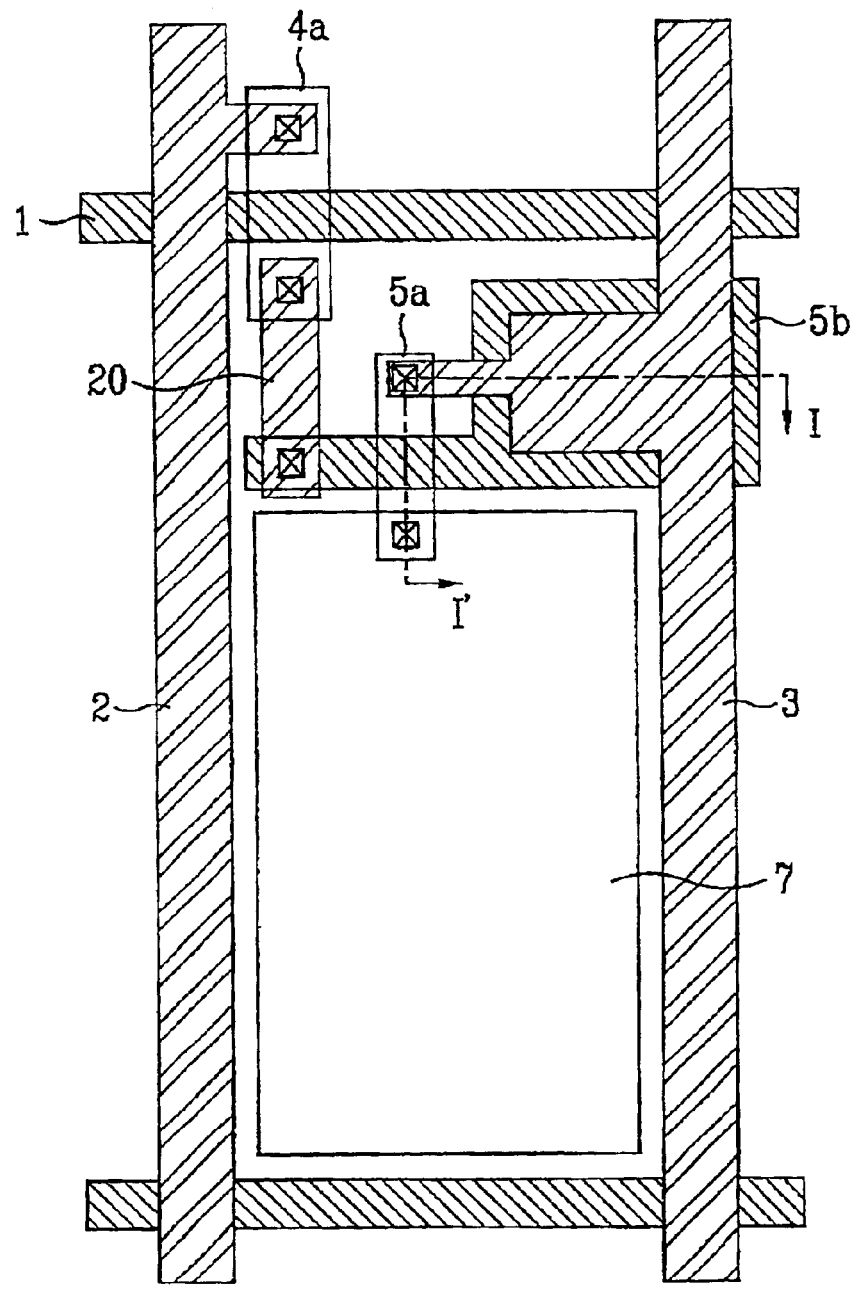
FIG. 2 illustrates a layout of the active matrix organic electroluminescence display device of FIG.1.
Figure 3:
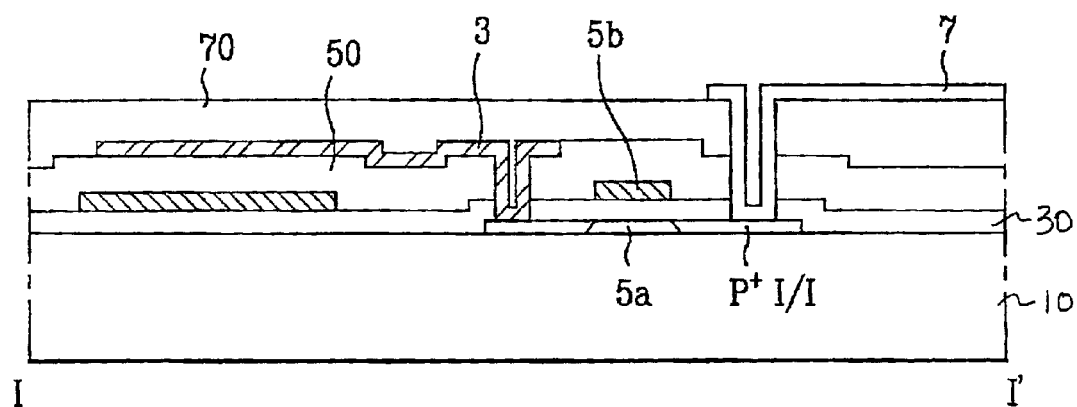
FIG. 3 illustrates a sectional view of the active matrix organic electroluminescence display device taken along line I–I' of FIG. 2.
Figure 4:
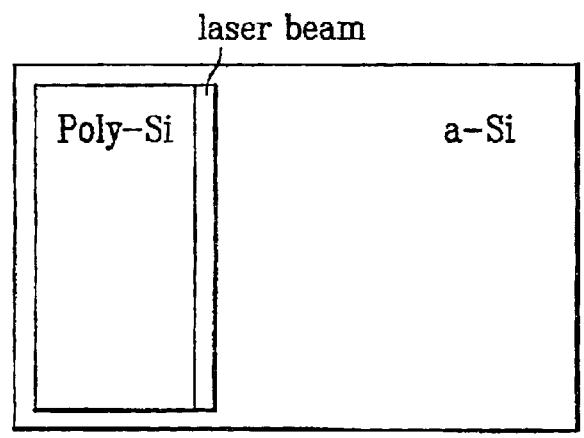
FIG. 4 illustrates a plan view for explaining a method of crystallizing by a related art scan method.
Figure 5:
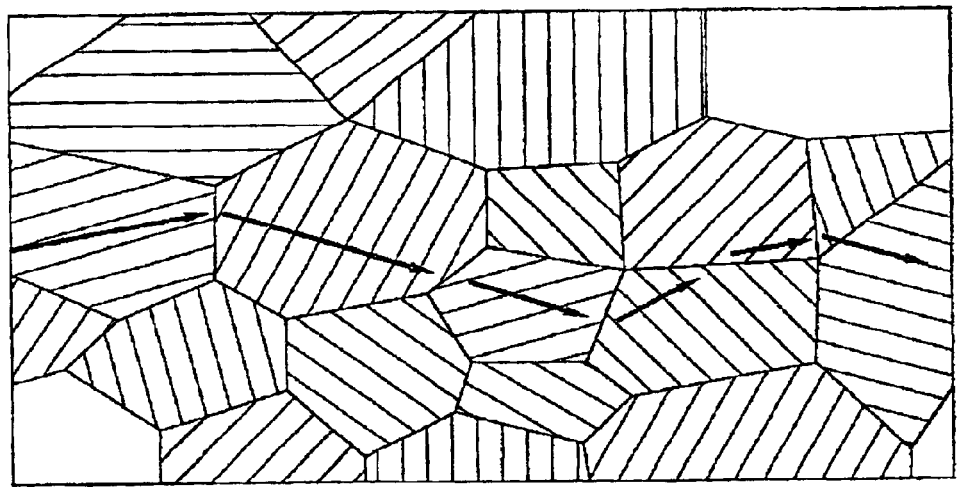
FIG. 5 illustrates a plan view of a polysilicon crystallized by the related art scan method.

FIG. 1 to FIG. 3 illustrate a layout and an equivalent circuit diagram of a unit pixel of an active matrix organic electroluminescence display device according to the present invention.

As shown in FIG. 1, a circuit structure of a pixel in the active matrix electroluminescence display device includes a scan line 1, a data line 2, a power line 3, an electroluminescence device 7, a switching transistor 4, a driving transistor 5 and a capacitor 6.

At this time, the scan line 1 is formed in one direction, and then the data line 2 is formed substantially perpendicular to the scan line 1. The power line 3 is formed substantially parallel to the data line 2 at a distance from the data line 2. The electroluminescence device 7 emits light according to a voltage applied in a pixel region formed by the scan line 1, the data line 2 and the power line 3. The switching transistor 4 switches a signal of the data line 2 according to a signal of the scan line 1. Subsequently, the driving transistor 5 applies a power supply of the power line to the electroluminescence device according to a signal applied from the switching transistor 4. The capacitor 6 is formed between the power line 3 and a gate electrode of the driving transistor 5.

If a pixel part having a plurality of pixel regions of FIG. 1 to FIG. 3, and gate and data driver integrated circuits (ICs) for driving the pixel part are formed in the same substrate, a thin film transistor (TFT) of the pixel part and TFTs of each driver IC are formed by a sequential lateral solidification (SLS) method, thereby obtaining uniformity of the TFTs.

Figure 6:
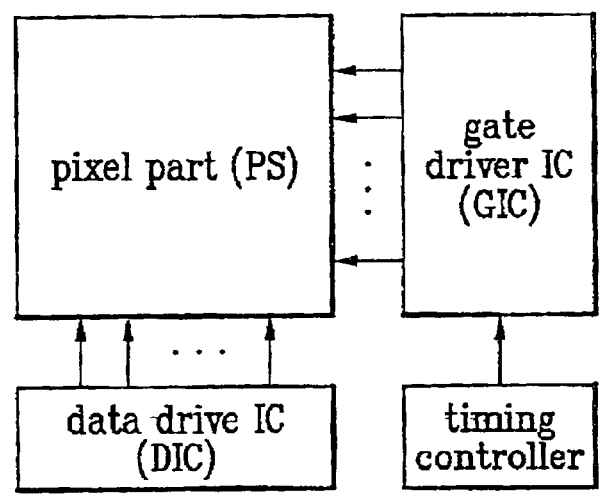
FIG. 6 illustrates a pixel region in the active matrix organic electroluminescence display device according to a first embodiment of the present invention.

FIG. 6 illustrates a TFT of a pixel part by a sequential lateral solidification (SLS) method in the active matrix organic electroluminescence display device according to the first embodiment of the present invention.

As shown in FIG. 6, the pixel part PS is formed on a substrate, and gate and data driver ICs GIC and DIC having a driving circuit for driving the pixel part PS are formed in the external of the substrate. Then, an active layer of the TFT of the pixel part PS is crystallized by the SLS method, and the active layer of the TFTs of the gate and data driver ICs is formed by low temperature polysilicon (LTPS) low temperature process and a excimer laser method.

Figure 7:
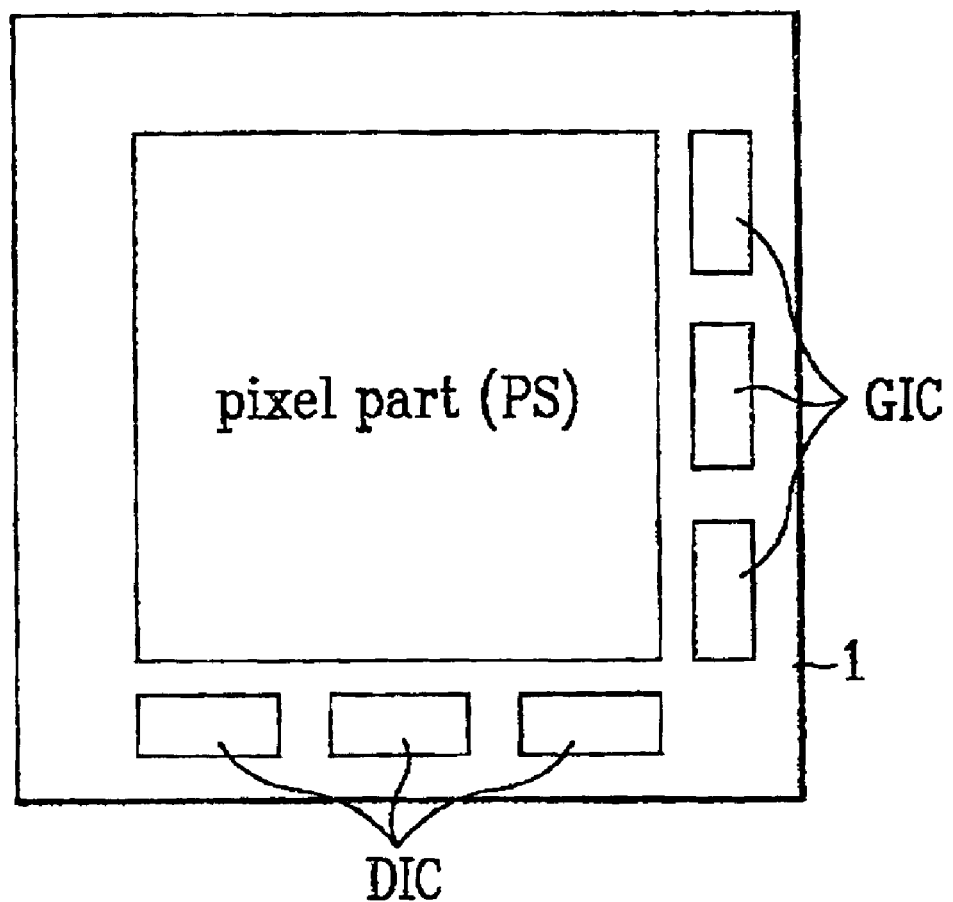
FIG. 7 illustrates a driving IC for driving the pixel region in the active matrix organic electroluminescence display device according to a second embodiment of the present invention.

FIG. 7 illustrates a pixel part and a TFT of a driver IC for driving the pixel part by an SLS method in the active matrix organic electroluminescence display device according to the second embodiment of the present invention.

As shown in FIG. 7, if a pixel part and gate and data driver ICs are formed on the same substrate, the pixel part and semiconductor layers of the TFTs in each driver IC are crystallized by an SLS method.

At this time, the semiconductor layer of the TFT in the pixel part is formed by LTPS low temperature process and an excimer laser method (scanning method), and the semiconductor layer of the TFT in each driver IC is formed by the SLS method.

In each embodiment of the present invention, the SLS method is formed any one of an SLS high-throughput poly-Si, an SLS directional poly-Si and an SLS x-Si (crystal-Si).

A method for manufacturing the TFT of the active matrix organic electroluminescence display device will be described in detail.

As shown in FIG. 2 and FIG. 3, island-shaped first and second semiconductor layers 4a and 5a are formed in portions of a substrate 10 where each TFT 4 and 5 will be formed.

At this time, an amorphous silicon a-Si:H is deposited on an entire surface of the substrate. Then, the amorphous silicon is crystallized to a polysilicon in a scanning method using an excimer laser, and then is selectively removed to form the first and second semiconductor layers 4a and 5a.

A gate insulating layer 30 is formed on an entire surface of the substrate including the first and second semiconductor layers 4a and 5a, and then a scan line 1 is formed to cross the first semiconductor layer 4a on the gate insulating layer 30. Then, a gate electrode of a driving transistor 5b is formed to cross the second semiconductor layer 5a. At this time, the scan line 1 and the gate electrode 5b of the driving transistor are isolated from each other, and the gate electrode 5b is widened at a certain portion to form the capacitor overlapped with a power line 3, which will be formed in a later step.

Impurity ions are injected to the first and second semiconductor layers at both sides of the scan line 1 and the gate electrode 5b of the driving transistor, thereby forming source and drain regions, respectively.

Accordingly, the switching transistor (TFT) 4 is formed by the scan line 1 and the first semiconductor layer 4a, and the driving transistor (TFT) 5 is formed by the gate electrode 5b and the second semiconductor layer 5a.

An insulating interlayer 50 is formed on the entire surface of the substrate including the scan line 1 and the gate electrode 5b, and then contact holes are respectively formed at the source and drain regions and the gate electrode 5b of the first semiconductor layer 4a, and the source region of the second semiconductor layer 5a.

A data line 2 connected to the source region of the first semiconductor layer 4a is formed substantially perpendicular to the scan line 1 on the insulating interlayer 50. Then, a power line 3 connected with the source region of the second semiconductor layer 5a is formed substantially perpendicular to the scan line 1 to be overlapped with the gate electrode 5b. An electrode pattern 20 is formed to connect the drain region of the first semiconductor layer 4a to the gate electrode 5b. At this time, a capacitor 6 is formed in a portion where the gate electrode 5b and the power line 3 are overlapped to each other.

Then, an insulating layer for planarization 70 is formed on the entire surface of the substrate. The contact hole is formed at the drain region of the second semiconductor layer 5a on the insulating layer 70, thereby forming an electroluminescence device 7 connected to the drain region.

A method of manufacturing the active matrix organic electroluminescence display device having the above structure according to the present invention will be described as follows.

An amorphous silicon a-Si:H is deposited on a substrate 10, and then is crystallized to a polysilicon by an SLS method. Then, the crystallized polysilicon is selectively removed to form the island shaped first and second semiconductor layers 4a and 5a corresponding to portions where switching and driving transistors 4 and 5 will be formed, respectively.

A method for crystallizing the amorphous silicon to the polysilicon by the SLS method will be described in detail.

Figure 8:
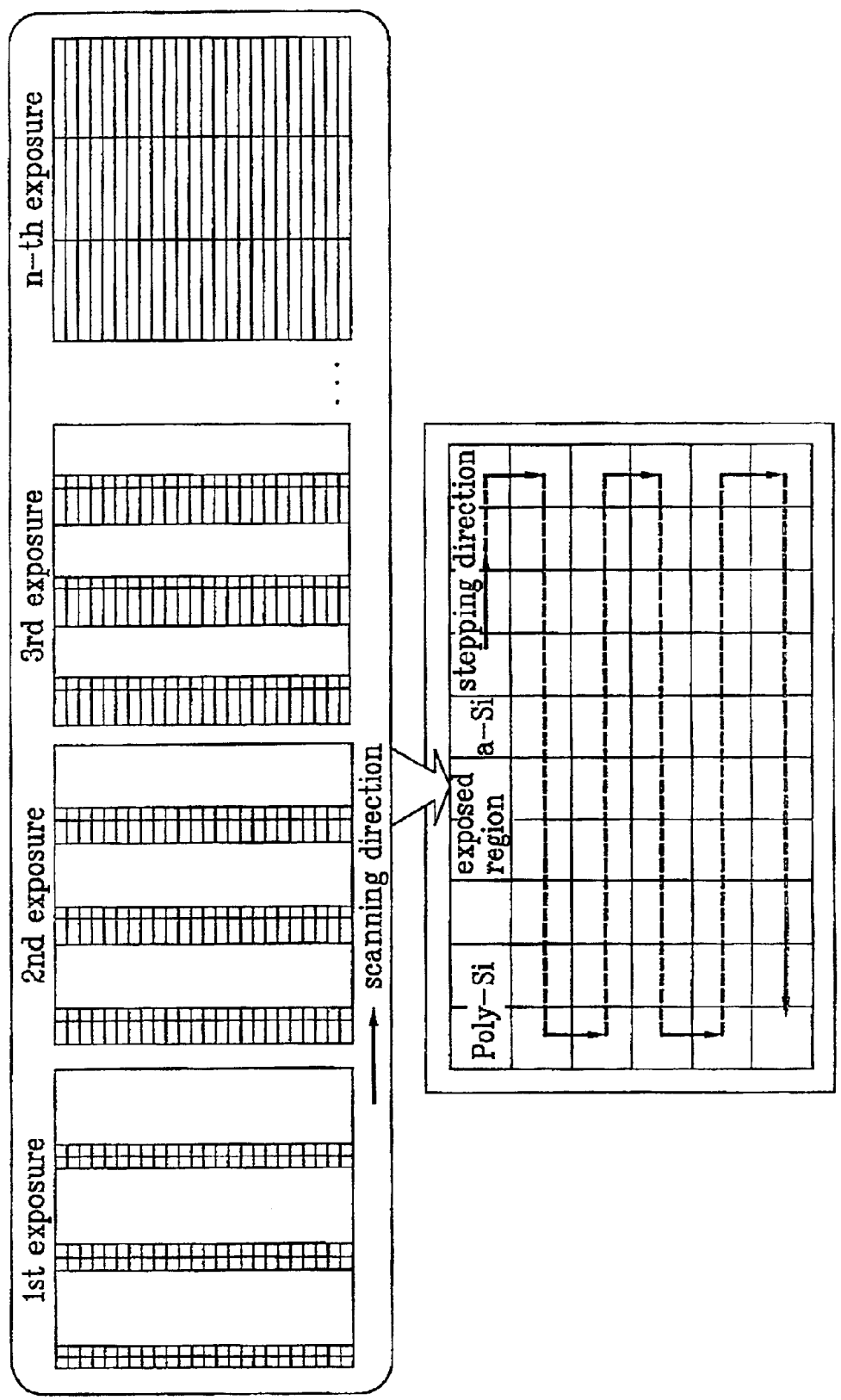
FIG. 8 illustrates a method for crystallizing by an SLS method according to the present invention.
Figure 9:
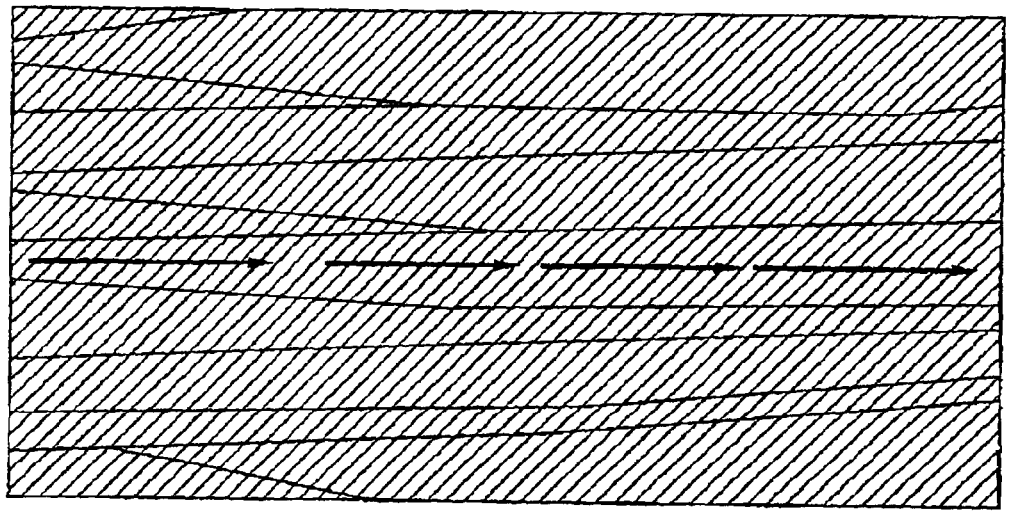
FIG. 9 illustrates a plan view of a polysilicon crystallized by an SLS method according to the present invention.

FIG. 8 is a plan view for illustrating the method for crystallizing the amorphous silicon by the SLS method according to the present invention. FIG. 9 illustrates a plan view of a polysilicon crystallized by the SLS method according to the present invention.

A beam of 2 $\mu$m×10 mm is emitted to the amorphous silicon to form an exposing area of 10×10 mm² per pulse or less by the SLS method, thereby crystallizing the amorphous silicon to the polysilicon.

As shown in FIG. 8, the beam is primarily emitted to the amorphous silicon at a constant interval, and then the beam is secondarily emitted to portions of the amorphous silicon, so that the amorphous silicon is crystallized.

As a result, as shown in FIG. 9, a grain boundary of the polysilicon crystallized is formed in parallel to a channel direction, thereby enhancing the movement of electrons.

A gate insulating layer 30 is formed on an entire surface of the substrate including the first and second semiconductor layers 4a and 5a, and then a metal layer is deposited on the entire surface of the substrate. Then, the metal layer is selectively removed to form the scan line 1 crossing the first semiconductor layer 4a on the gate insulating layer 30, simultaneously, to form the gate electrode 5b of the driving transistor crossing the second semiconductor layer 5a.

At this time, the scan line 1 and the gate electrode 5b of the driving transistor are isolated from each other, and then the gate electrode 5b is widened at a certain portion to form the capacitor overlapped with the power line 3 that will be formed.

Impurity ions are injected to the first and second semiconductor layers 4a and 5a using the scan line 1 and the gate electrode 5b of the driving transistor as masks, thereby forming the source and drain regions of the switching and driving transistors.

Accordingly, the switching transistor 4 is formed by the scan line 1 and the first semiconductor layer 4a, and the driving transistor 5 is formed by the gate electrode 5b and the second semiconductor layer 5a.

An insulating interlayer 50 is formed on the entire surface of the substrate including the scan line 1 and gate electrode 5b. Then, the insulating interlayer 50 and the gate insulating layer 30 are selectively removed to expose the source and drain regions and the gate electrode 5b of the first semiconductor layer 4a, and the source region of the second semiconductor layer 5a, thereby forming contact holes.

The metal layer is deposited on the entire surface of the substrate, and then is selectively removed, so that the data line 2 connected with the source region of the first semiconductor layer 4a is formed substantially perpendicular to the scan line 1 on the insulating interlayer 50. Simultaneously, the power line 3 connected with the source region of so the second semiconductor layer 5a is formed substantially perpendicular to the scan line 1 to be overlapped with the gate electrode 5b. Then, the electrode pattern 20 is formed to connect the drain region of the first semiconductor layer 4a to the gate electrode 5b.

Then, the insulating layer for planarization 70 is formed on the entire surface of the substrate. The contact hole is formed at the drain region of the second semiconductor layer 5a on the insulating layer 70, thereby forming the electroluminescence device 7 connected to the drain region.

As mentioned above, the active matrix organic electroluminescence display device of the present invention has the following advantages.

First, a TFT of a driving part for driving an EL device and/or a TFT of a driver IC connected to the driving part are formed by an SLS method, thereby enhancing uniform luminance by improving the TFT characteristic. Therefore, it is possible to improve an aperture ratio of the device with a small number of transistors.

Furthermore, the TFT of the driver IC (external driving circuit) is formed by the SLS method, so that a pixel and a driving circuit can be formed in the same substrate, thereby obtaining miniaturization of the device.

It will be apparent to those skilled in the art than various modifications and variations can be made in the present invention. Thus, it is intended that the present invention covers the modifications and variations of this invention provided they come within the scope of the appended claims and their equivalents.

What is claimed is:

1. An active matrix organic electroluminescence display device comprising:

a scan line in one direction;

a data line substantially perpendicular to the scan line;

a power line substantially parallel to the data line, keeping a distance with the data line;

an electroluminescence device emitting light in a pixel region among the scan line, the data line and the power line;

a switching transistor for switching a signal of the data line according to a signal of the scan line, the switching transistor including a channel region made of polycrystalline silicon having a longitudinal grain, wherein the longitudinal grain is substantially parallel to a current flow direction in the channel region; and a driving transistor for applying a power supply of the power line to the electroluminescence device according to a signal applied through the switching transistor.

2. The active matrix organic electroluminescence display device as claimed in claim 1, wherein the longitudinal grain is formed by a sequential lateral solidification (SLS) method, and the SLS method is any one of an SLS high-throughput poly-Si, an SLS directional poly-Si, and an SLS x-Si (crystal-Si).

3. The active matrix organic electroluminescence display device as claimed in claim 1, further comprising a capacitor storing electrons according to a difference between a voltage of data signal applied to the data line and a voltage provided from the power line.

4. An active matrix organic electroluminescence display device comprising:

a plurality of scan lines in one direction;

a plurality of data lines substantially perpendicular to the scan line to define a plurality of pixel regions;

a plurality of power lines substantially parallel to the data line and a distance from the data line;

an electroluminescence device emitting light in each of the pixel regions among the scan line, the data line and the power line;

a switching transistor for switching a signal of the data line according to a signal of the scan line in each of the pixel regions;

a driving transistor for applying a power supply of the power line to the electroluminescence device according to a signal applied through the switching transistor in each of the pixel regions;

a gate driver IC having a plurality of transistors for applying a scan signal to each scan line; and a data driver IC having a plurality of transistors for applying a data signal to each data line;

wherein each of the switching transistor, the driving transistor and the transistors in the gate drive IC and the data drive IC includes a channel region made of polycrystalline silicon having a longitudinal grain, and the longitudinal grain is substantially parallel to a current flow direction in the channel region.

5. The active matrix organic electroluminescence display device as claimed in claim 4, wherein the switching transistor and the driving transistor are formed by low temperature polysilicon low temperature process and a scanning method.

6. The active matrix organic electroluminescence display device as claimed in claim 4, wherein the longitudinal grain is formed by a sequential lateral solidification (SLS) method, and the SLS method is formed any one of an SLS high-throughput poly-Si, an SLS directional poly-Si and an SLS x-Si (crystal-Si).

7. An active matrix organic electroluminescence display device comprising:

a scan line in one direction;

a data line substantially perpendicular to the scan line;

a power line substantially parallel to the data line, keeping a distance with the data line;

an electroluminescence device emitting light in a pixel region among the scan line, the data line and the power line;

a switching transistor for switching a signal of the data line according to a signal of the scan line; and a driving transistor for applying a power supply of the power line to the electroluminescence device according to a signal applied through the switching transistor, the driving transistor including a channel region made of polycrystalline silicon having a longitudinal grain, wherein the longitudinal grain is substantially parallel to a current flow direction in the channel region.

8. The active matrix organic electroluminescence display device as claimed in claim 7, wherein the longitudinal grain is formed by a sequential lateral solidification (SLS) method, and the SLS method is any one of an SLS high-throughput poly-Si, an SLS directional poly-Si, and an SLS x-Si (crystal-Si).

9. The active matrix organic electroluminescence display device as claimed in claim 7, further comprising a capacitor storing electrons according to a difference between a voltage of data signal applied to the data line and a voltage provided from the power line.

* * * * *